United States Patent
Gautier Le Boulch et al.

(10) Patent No.: US 11,966,800 B2
(45) Date of Patent: Apr. 23, 2024

(54) CHIPLESS RADIO FREQUENCY IDENTIFICATION DEVICES ("RFID")

(71) Applicant: Inkjet Engine Technology, Meudon (FR)

(72) Inventors: Louis Gautier Le Boulch, Meudon (FR); Edmond Abergel, Paris (FR)

(73) Assignee: IDYLLIC TECHNOLOGY, Valence (FR)

( * ) Notice: Subject to any disclaimer, the term of this patent is extended or adjusted under 35 U.S.C. 154(b) by 0 days.

(21) Appl. No.: 17/801,225

(22) PCT Filed: Feb. 18, 2021

(86) PCT No.: PCT/EP2021/054069
§ 371 (c)(1),
(2) Date: Aug. 19, 2022

(87) PCT Pub. No.: WO2021/165422
PCT Pub. Date: Aug. 26, 2021

(65) Prior Publication Data
US 2022/0414408 A1    Dec. 29, 2022

(30) Foreign Application Priority Data
Feb. 20, 2020 (EP) .................................... 20305162

(51) Int. Cl.
*G06K 19/067* (2006.01)
*H01Q 1/22* (2006.01)

(52) U.S. Cl.
CPC ....... *G06K 19/0672* (2013.01); *H01Q 1/2225* (2013.01)

(58) Field of Classification Search
CPC . G06K 19/0672; H01Q 1/2225; H05K 1/0225
See application file for complete search history.

(56) References Cited

U.S. PATENT DOCUMENTS

2013/0057365 A1* 3/2013 Mizushima ............. H01P 5/028
                                                          333/238
2015/0380824 A1* 12/2015 Tayfeh Aligodarz ........................
                                                      H01Q 15/0066
                                                          430/319

FOREIGN PATENT DOCUMENTS

EP         3537855 A1    9/2019

OTHER PUBLICATIONS

Ma Zhong-Hua et al. "A re-transmitted chipless tag using CSRR coupled structure" Microsystem Technologies, Berlin, DE, vol. 24, No. 10, Apr. 2, 2018 (Apr. 2, 2018), pp. 4373-4382, [retrieved on Apr. 2, 2018-] DOI: 10.1007/S00542-018-3836-Z ISSN: 0946-7076, XP036598677.

Peixeiro Custodio. "High efficiency aperture-coupled stacked-patch antennas with foam substrate" 2013 IEEE Antennas and Propagation Society International Symposium (APSURSI), IEEE, Jul. 7, 2013 (Jul. 7, 2013), pp. 1828-1829, [retrieved on Jan. 13, 2014] DOI: 10.1109/APS.2013.6711573 ISSN: 1522-3965, XP032555894.

(Continued)

*Primary Examiner* — Matthew Mikels

(57) ABSTRACT

The present invention relates to a radio frequency identification (personalized) device (RFID) without chip, in particular to a RFID tag (personalized) without chip, also referred to as chipless RFID tag.

22 Claims, 1 Drawing Sheet

Different tag geometries made in connection with the invention

(56) References Cited

OTHER PUBLICATIONS

Svanda Milan et al. "Platform Tolerant. High Encoding Capacity Dipole Array-Plate Chipless RFID Tags" IEEE Access, vol. 7, Aug. 14, 2019 (Aug. 14, 2019), pp. 138707-138720 DOI: 10.1109/ACCESS.2019.2935258 XP0 117 48327.

Corchia Laura et al. "A Chipless Humidity Sensor for Wearable Applications" 2019 IEEE International Conference on RFID Technology and Applications (RFID-TA), IEEE, Sep. 25, 2019 (Sep. 25, 2019), pp. 174-177 DOI: 10.1109/RFID-TA.2019.8892048 XP033648925.

* cited by examiner

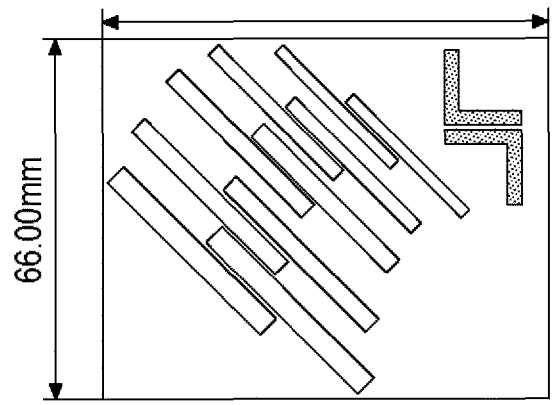
Different tag geometries made in connection with the invention

CHIPLESS RADIO FREQUENCY IDENTIFICATION DEVICES ("RFID")

The present invention relates to a radio frequency identification (personalized) device (RFID) without chip, in particular to an RFID (personalized) tag without chip, also referred to as a "chipless RFID tag".

By "device" is meant a packaging, document, in particular a security document or possibly any object incorporating the claimed chipless RFID tag.

Data transmission systems that use radio frequency identification technology are widely used to identify all types of objects and living beings (for example an animal or a human) bearing an adapted device (tag). Over recent decades, RFID technology has become increasingly used for information storage and transmission.

This RFID technology uses a radio tag, also called a transponder (from the contraction of the words "transmitter" and "responder"), that is placed on an object, and a reader, also called an interrogator, to read and identify the radio tag. RFID technologies are generally classified into "active" or "passive" radio tags. Active radio tags have a local energy source (such as a battery) which they use to send a signal to the reader; they are thus generally characterised by a relatively long transmission signal range. However, passive radio tags do not have an internal power supply since their signal transmission energy comes from the reader itself, and in particular the reception of the signal transmitted by the reader; thus, passive radio tags have a much weaker signal range, usually less than 8 metres.

From a practical point of view, RFID technology uses radio frequencies ("RF") that have much higher material penetration characteristics than optical signals. Thus, when compared with barcodes, RFID technology will enable use in much more hostile environments; for example, RFID tags can be read through all sorts of materials such as paper, cardboard, wood, paint, water, dirt, dust, animal or human bodies, concrete or through the tagged item itself or its packaging. This characteristic has opened up a wide range of applications for RFID tags, among them we can cite for example, identification of property and persons, in particular packaging, cars (car parks, tolls . . . ), inventory management, electronic access cards, not to mention all security documents such as means of payment for example, a bank note, cheque or restaurant voucher or identity documents such as identity cards, visas, passports or driving licenses or lottery tickets, transport tickets or entrance tickets to cultural or sporting events.

There are two main types of RFID tags, tags incorporating an electronic integrated circuit, called IC tags and tags that do not incorporate an electronic integrated circuit, usually referred to as chipless RFID tags.

(Actives or passive) RFID IC tags usually comprise an antenna, electronic circuit and a memory to store an identification code. The electronic circuit is used in particular to receive the signal transmitted by the reading device and to transmit a response, in a determined frequency band, in the form of a modulated signal containing the identification code stored in the memory. For passive RFID IC tags, a share of the energy carried by the radio waves transmitted by the reading device is used to provide electric power to the chip.

Due to the presence of electronic circuits in IC RFID tags, these tags have a non-negligible cost price. It is with the goal of reducing this cost price that we have proposed developing chipless tags. This type of RFID tag requires neither an integrated circuit, nor discrete electronic components, such as a transistor and/or a coil and/or a capacitance and/or an antenna for example; it is their conductive geometric characteristic that engenders a specific behaviour, in particular of the resonator type. This set frequency resonance characteristic enables the chipless RFID tags to be read directly on an object at costs lower than those of conventional RFID tags.

The increase in the encoding capacity of chipless radio frequency identification devices as well as the manufacture of these devices and, in particular, the industrial manufacture of discriminating devices are significant challenges for prior art.

In "Microsystems Technologies" (volume 24, pages 4373-4382 (2018)), Zhong-Hua Ma, Jian-Hong Yang, Chih-Cheng Chen and Cheng-Fu Yang propose a re-transmitted chipless tag based on a high-Q CSRR structure operating on the UWB frequency band, which is composed of two orthogonal polarization transmitting and receiving microstrip broadband monopole antennas, loaded with multiple CSRR resonators. In the experimental part of this article, in chapters 6 and 7, it is first and foremost a Rogers 4350 type dielectric substrate that is used (with a relative dielectric constant of 3.66, a loss tangent of 0.004 and a thickness of 0.508 mm—several thicknesses being also tested (0.3, 0.508 and 0.8 mm, respectively), this dielectric substrate is then replaced respectively by a plastic substrate (with a relative dielectric constant of 3.1, a loss tangent of 0.008 and a thickness of 1 mm) as well as by foam (relative dielectric constant of 1.06, a loss tangent of 0.0015 and thickness of 1 mm,) the only conclusion being drawn from these changes being that "The output spectrum correctly indicates the encoding status" without any other indication.

In the publication "2013 IEEE Antennas and Propagation Society International Symposium (APSURSI), Conference: 7-13 Jul. 2013, IEEE Xplore: 27 Jan. 2014, INSPEC Accession Number: 14058155, DOI: 10.1109/APS.2013.6711573, pages 1828-1829", Peixeiro Custodio presents high efficiency microstrip patch antenna elements developed as part of an EU research project on "green radio" technology. FIG. 1 represents a stacked patch configuration coupled with a broadband aperture with substrates comprising 3 layers of Rogers Duroid 5880 and one 10-mm thick foam layer. These antennas do not have the same function/utility as the chipless tags in the present invention—the design issues are therefore different.

In [IEEE Access (Volume: 7)/Page(s): 138707-138720/Publication Date: 14 Aug. 2019/Electronic ISSN: 2169-3536/INSPEC Accession Number: 19088375/DOI: 10.1109/ACCESS.2019.2935258] Svanda Milan et Al. describe "High Encoding Capacity Dipole Array-Plate Chipless RFID Tags". In the last paragraph of section III relating to 20-Bit chipless RFID tag topology, it is stated that the substrate is composed of Rogers RO4350 (relative dielectric constant of 3.66, a loss tangent of 0.003 and a thickness of 0.1 mm) and a foam layer (relative dielectric constant of 1.3, a loss tangent of 0.02 and a thickness of 1 mm).

In the publication [2019 IEEE International Conference on RFID Technology and Applications (RFID-TA)—Date of Conference: 25-27 Sep. 2019—INSPEC Accession Number: 19135523—pages 174-177], Laura Corchia et Al. describe "A Chipless Humidity Sensor for Wearable Applications", i.e. humidity sensors for clothes.

In an article published in IEEE Transactions on Microwave Theory and Techniques (Pages: 4547-4558 of Volume: 67, Issue: 11, November 2019—"Scalar Method For Reading of Chipless RFID Tags Based on Limited Ground Plane Backed Dipole Resonator Array"), Jan Kracek describes a scalar method for reading chipless RFID tags. This publication describes in FIG. 9(a) a chipless RFID tag comprising a dipole resonator array with ground plane with intermediate layers composed of an RO4350 substrate (Rogers type dielectric) 0.1 mm thick, with relative permittivity of 3.66 and a loss tangent of 0.003, as well as a 1-mm thick foam layer inserted between the ground plane and the substrate, relative permittivity of 1.3 and a loss tangent of 0.02.

While chipless RFID technology has a bright future, it is nonetheless true that improvements to chipless RFID tag reading performance are still being sought. By reading performance we mean the capacity of the tag to be read and identified i.e. by increasing the signal level of the tag for example (wanted signal carrying the tag information) compared to the other signals such as measurement noise or the signals backscattered by other objects close to the tag. Specific work on the tag itself and in particular the materials composing it is essential to address the issue of reading performance as well as the manufacturing and cost of these tags. The materials used to make the tags will have a direct impact on the wanted signal backscattered by the tag.

Invention

Thus, the present invention provides a promising solution to this issue by proposing one of the new radio frequency identification (personalized) devices (RFID) without chip, in particular an RFID (personalized) tag without chip, also referred to as "chipless RFID tags.

Specifically, this invention concerns chipless radio frequency identification devices, preferably chipless RFID tags, characterised in that they comprise a particular dielectric substrate surmounted with a pattern or patterns composed of a layer of conductive material; preferably a dielectric substrate made from solid foam, foam board, corrugated cardboard, cellular cardboard or fabric (for example a material composed of threads or fibres interlaced in cotton, hemp, flax or synthetic materials such as nylon, polyamide or viscose), surmounted with a pattern or patterns composed of a layer of conductive material.

As described in greater detail in the following description, by solid foam we mean preferably a dielectric material that can be rigid, or flexible, that contains a significant percentage of air or gas bubbles and therefore that, while taking up a certain volume, contains very little solid state material, the solid state being preferably a state of the material characterised by the absence of freedom between the molecules or ions, thus, a foam is generally characterised by a very low relative permittivity, i.e. close to 1, 1 being the permittivity value of air.

Indeed, the applicant has observed in an unexpected way that this dielectric and conductive pattern assembly according to the present invention enabled devices to be obtained that presented not only optimal resonance characteristics while presenting superior radiating efficiency and also superior reading performance; thus, it is at least the sum of two layers, dielectric and conductive pattern, that define the resonance characteristics of the device according to the invention. This discovery opens up a vast field of new applications in the area of chipless RFID tags since, as demonstrated in the present application, it is possible to easily identify the corresponding devices (their RF signature remaining recognizable) while facilitating their manufacture. This is all the more unexpected and counter-intuitive since it was known in prior art that preserving the tag surface conductive properties was a manufacturing requirement so the tag could keep a usable radiofrequency signal; this is even more unexpected and counter-intuitive since it was known in prior art that the presence of a substrate with strong permittivity enabled the capacity of the tag to resonate to be improved (increase in the quality factor of the tag resonators). Indeed, the higher the permittivity of the substrate, the more the field is stored at the level of the dielectric present near the conductive layers and the better the resonance (increase in the quality factor). Yet, a high quality factor is known for being a fundamental criterion in the capacity of the reader to read the tag in a real environment, i.e. containing objects other than the RFID tag. The higher the quality factor, the greater the possibility of temporally separating the signal transmitted by the tag from the environment signal which enables a correct measurement of the tag to be made and this is therefore the configuration sought in practice.

In the present invention, the use of the qualifier "personalized" for the devices/tags claimed quite simply confirms that it is possible to identify/discriminate the device/tag.

Dielectric Substrate

The chipless RFID devices/tags according to this invention are therefore characterised in that they include a particular dielectric substrate.

This particular dielectric substrate will be advantageously selected from among the dielectric substrates that meet at least one of the following conditions:

a bulk density less than 250 kg·m$^{-3}$, for example less than 100 kg·m$^{-3}$, and/or a relative permittivity less than 3, preferably less than 2, preferably less than 1.25. For example, this relative permittivity will be less than 1.10. In a particular embodiment according to the present invention, this relative permittivity will be close to 1. This relative permittivity will be preferably greater than 1.001. For example, this relative permittivity will be greater than 1.01, and/or a loss tangent value less than 10$^{-2}$, preferably less than 10$^{-3}$, for example less than 2.10$^{-4}$.

This particular dielectric substrate will be advantageously selected from among the dielectric substrates made from solid foam, foam board, corrugated cardboard, cellular cardboard or fabric (for example a material composed of threads or fibres interlaced in cotton, hemp, flax or synthetic materials such as nylon, polyamide or viscose).

This dielectric substrate will be advantageously rigid or flexible; it is preferably presented in the form of a film.

The thickness of the dielectric substrate will be advantageously greater than 0.1 mm. This thickness will be preferably greater than 0.5 mm. For example this thickness will be greater than 0.75 mm.

The thickness of the dielectric substrate will be advantageously less than 3 mm. This thickness will be preferably less than 1.5 mm. For example this thickness will be less than 1.25 mm.

Any dielectric substrate that meets the reading, resonance and discrimination performance goals according to the present invention could be advantageously used within the framework of the present invention. For illustrative purposes we can cite fabric (for example a material composed of threads or fibres interlaced in cotton, hemp, flax or synthetic materials such as nylon, polyamide or viscose), corrugated cardboard, cellular cardboard, foam board, solid foam, for example polymers or biopolymers.

In a particular embodiment according to the present invention, the dielectric substrate is characterised by its bulk density which is less than 250 kg·m$^{-3}$, for example less than 100 kg·m$^{-3}$. The bulk density can be measured by any appropriate method, by weighing for example. Unless indicated otherwise, bulk densities are given for bodies at a temperature of 20° C., under normal atmospheric pressure (1,013 hPa). Any ASTM or ISO method applicable to the type of material selected as the dielectric substrate could therefore be advantageously used to measure this bulk density; regardless of the ASTM or ISO method chosen (and applicable to the type of material selected), the measurement of the bulk density will therefore be preferably less than 250 kg·m$^{-3}$, less than 100 kg·m$^{-3}$ for example.

In a particular embodiment according to the present invention, the dielectric substrate is characterised by its dielectric properties, i.e. a relative permittivity less than 3, preferably less than 2. This relative permittivity will be less than 1.25. For example, this relative permittivity will be less than 1.10. In a particular embodiment according to this invention, this relative permittivity will be close to 1. This relative permittivity will be preferably greater than 1.001. For example, this relative permittivity will be greater than 1.01.

In a particular embodiment according to the present invention, the dielectric substrate is characterised by its dielectric properties, i.e. a loss tangent value less than $10^{-2}$, preferably less than $10^{-3}$, for example less than $2.10^{-4}$.

As a reminder, dielectric permittivity is a physical property that describes the response of a material when an electric field is applied to it; and the loss tangent is also called the dielectric dissipation factor.

The relative permittivity and loss tangent ("tan δ") can be measured by any appropriate method. For illustrative purposes we can cite the use of dielectric spectroscopy or resonator cavities which are commonly used dielectric analysis techniques. These techniques are based on measuring the complex impedance of a sample at a given frequency or even at a given temperature also. The present invention relates to applications for temperatures around ambient temperature (typically between −20° C. and +80° C.), in this temperature range, permittivity and dielectric losses of dielectric materials commonly present around us can be considered as relatively constant in particular in the bandwidth of interest that is the ULB bandwidth between 3 GHz and 10 GHz.

This method provides access to the permittivity value of a material and also to its tan δ loss factor at a given frequency for example. The values indicated in this description and the claims that follow correspond to those measured at any frequency within the frequency band of 3 GHz to 10 GHz, at a temperature of 20° C.

In particular, the values indicated in the examples that follow have been measured by means of the Damaskos 08 model ("Thin Sheet Tester—Cavity") which provides an excellent estimate of the dielectric permittivity of dielectric substrates; this Damaskos thin sheet tester also gives the measurement of the loss tangent of the dielectric over the 800-4000 MHz band in a non-destructive manner which is particularly suited to our substrates. The measurement is carried out on common vectorial and scalar analysers controlled by Damaskos equipment with data processing being carried out by Damaskos' "Cavity" software which offers very good repeatability.

Solid Foam

Solid foam (e.g. polymer foam), is a solid foam used in numerous applications such as heat insulation, acoustic insulation, packaging, the motor industry, etc. This foam can be assimilated to a continuous solid network comprising trapped gas bubbles (usually air) which enables the properties of a foam (density, lightness) to be combined with those of a solid.

The solid foam can be advantageously characterised by its nature, density, closed or open cell structure, the size of its bubbles and the arrangement of the said bubbles in the space.

A solid foam is said to be of low density when it contains over 90% gas, which corresponds to a bulk density of less than 100 kg·m$^{-3}$. A foam of average density has a bulk density of between 100 and 600 kg·m$^{-3}$. Finally a high density solid foam contains less than 60% gas, which corresponds to a bulk density of over 600 kg·m$^{-3}$. Bulk density can be measured by any appropriate method, for example by weighing. Unless indicated otherwise, bulk densities are given for bodies at a temperature of 20° C., under normal atmospheric pressure (1,013 hPa).

The solid foam used in the present invention will preferably have a bulk density of less than 250 kg·m$^{-3}$. For example it will have a bulk density of less than 100 kg·m$^{-3}$.

The solid foam used in the present invention will preferably have a cell density of between $10^4$ and $10^9$ bubbles/cm$^3$. For example it will have a bubble density of between $10^5$ and $10^8$ bubbles/cm$^3$.

The solid foam used in the present invention will preferably have a bubble size the average diameter of which is between 5 microns and 1 millimetre. For example it will have an average diameter of between 20 microns and 200 microns.

Any material presenting the foam characteristics claimed under the present invention may be advantageously selected. For illustrative purposes we can cite foam board, polymers or biopolymers. By polymer we mean in general an assembly of several macromolecules (molecule composed of the repetition of numerous sub-units), in general, when the molar mass of the material is greater than 2,000 g/mole we speak of a polymer.

In a particular embodiment according to the present invention, the solid foam will be a polymer foam, for example a polymer selected from among the thermosetting polymers such as the polyurethanes, epoxides, . . . or, preferably, among the thermoplastics such as polystyrene, polyvinyl chloride, polypropylene, polyethylene, polyethylene terephthalate (PET) and/or a mix of one or more of these polymers cited. A foam comprising over 80% in weight, for example over 90% in weight, of polyethylene (PE) or polyethylene terephthalate (PET) will be advantageously selected in the framework of the present invention.

The morphology of the foams, in particular the size and density of the bubbles, may be determined by any appropriate method. For illustrative purpose, the foam (e.g. polymer foam) is fractured under liquid nitrogen in order to be positioned under the polymer's glass transition temperature; since the fracture surface is clean, the bubbles are not deformed and can be observed under the microscope for example. Preferable an electronic microscope coupled to an image analysis software will be used that is capable of counting the number of bubbles; and also capable of calculating the average surface area of the bubbles for each image, which enables the average diameter of the bubbles to be determined as well as the equivalent average diameter when the bubbles are not spherical—bubble density (the number of bubbles per cm$^3$) is determined by the formula $(n/A)^{(3/2)}$ with n being the number of bubbles in the image and A the surface area of the image.

The polymer foam can be prepared by any appropriate method. For illustrative purposes we can cite physical foaming with gas injection ($CO_2$ or nitrogen ($N_2$) for example) or chemical foaming with the addition and decomposition of a foaming agent (for example 5-Phenyltetrazole, p-toluenesulfonyl semicarbazide, Dinitrospoenta-methyleneteTramine, p-Toluene sulfonyl hydrazide, p.p-Oxybis(benzene)sulfonyl hydrazide and/or Azodicabonamide which is preferably used).

A blowing extrusion process is particularly suited to preparing a polymer foam film that can be used under the present invention.

Nucleating agents can be advantageously added to the polymer which enables small bubbles to be obtained. For illustrative purposes we can cite inorganic loads (for example stearic acids, calcium stearate, zinc stearate, calcium carbonate, magnesium silicate, talc, sodium benzoate, organic phases such as elastomers and/or rubber particles, carbon black, and/or nanoparticles such as for example nanoclays or carbon nanoparticles (for example nanotubes).

In a particular embodiment according to the present invention, the solid foam will be selected from among foam boards, also known under the tradename Carton Plume; this type of material typically comprises three layers including one main internal layer of polymer foam (for example polystyrene, polyurethane, polyethylene and/or polyethylene terephthalate (PET)) coated on the outside with a fine film, for example paper or plastic. The type of paper or plastic representing the optional superior layer of the dielectric substrate surmounted with a pattern or patterns composed of a layer of conductive material is not critical since it represents a tiny thickness compared to that of the solid foam as explained in detail below.

In general, and in a particular embodiment according to the present invention, the dielectric substrate (for example solid foam, foam board, corrugated cardboard, cellular cardboard and/or fabric, preferably solid foam) with its characteristics such as described and/or claimed here accounts for at least 95% in volume and/or 95% in thickness and/or 95% in weight of the entirety of the dielectric substrate on which are placed the pattern or patterns composed of a layer of conductive material, preferably at least 99% in volume and/or 99% in thickness and/or 99% in weight of the entirety of the dielectric substrate on which are placed the pattern or patterns composed of a layer of conductive material. The present invention therefore also concerns a chipless RFID tag consisting of a dielectric substrate that is itself made up of a dielectric substrate with its characteristics such as described and/or claimed here, surmounted with a fine dielectric layer on which are placed the pattern or patterns composed of a layer of conductive material; this fine dielectric layer (for example a paper, or cardboard or plastic material film (for example: a polyethylene (PE), polypropylene (PP) or preferably polyethylene terephthalate (PET)) therefore advantageously represents less than 5%, or even less than 1% of the thickness of the entirety of the dielectric substrate.

While being optional and non-critical from the outset, the Applicant has observed that this fine dielectric layer or dielectric film provided numerous additional benefits to the RFID tag claimed when some preferred requirements are met.

Firstly, it is important to mention that the "relative" values of relative permittivity and loss tangent of the corresponding dielectric stack of the tag claimed will always have values meeting the characteristic values claimed; the influence of the additional dielectric film on the dielectric assembly will therefore be insignificant in relation to these criteria.

Then, and this is a considerable advantage in an embodiment according to the present invention, the Applicant has observed that the flatness and/or the surface condition of the dielectric surface on which the conductive pattern was placed could also represent an additional problem in making the tag; indeed, since it frequently happens that the upper layer of the main dielectric (for example solid foam, foam board, corrugated cardboard, cellular cardboard and/or fabric, preferably solid foam) of the tag does not present sufficient flatness and/or a good surface condition, the use of an additional dielectric film enabled better results/performances to be achieved since, among other things, it provided this flatness and/or surface condition sought. Thus, by placing the pattern or patterns composed of a layer of conductive material directly on this dielectric film, better performances were obtained. Any appropriate method could be used to characterise this flatness and/or surface condition of the conductive film. For illustrative purposes, and to avoid having to enter into measurement considerations that are difficult to implement, the tags claimed will be advantageously characterised by a total thickness at all points of the tag that varies by less than one hundred (100) microns, preferably by less than fifty (50) microns, for example by less than forty (40) microns, by less than twenty (20) microns, by less than ten (10) microns, or even for example by less than two (2) microns. The positioning of the pattern or patterns composed of a layer of conductive material directly on this dielectric film could be performed using any appropriate method as explained below in the description, for example by printing, for example by ink jet printing. Then, the dielectric film covered with the pattern or patterns composed of a layer of conductive material could be added to the main dielectric substrate (solid foam, foam board, corrugated cardboard, cellular cardboard and/or fabric, preferably solid foam) in any direction/order; the Applicant even found an advantage in stacking the elements in the following order (1) main dielectric substrate—(2) conductive pattern—(3) dielectric film—since this stacking order enabled the conductive patterns to be advantageously protected during handling and/or use of the tag since these patterns were protected at once on one side by the main dielectric substrate and on the other side by the dielectric film.

In a particular embodiment, the dielectric film is characterised by one, two or more of the following characteristics:
- a relative permittivity measured at any frequency between 3 and 10 GHz greater than that of the main dielectric substrate (solid foam, foam board, corrugated cardboard, cellular cardboard and/or fabric, preferably solid foam), preferably a relative permittivity greater than 1.25, for example greater than 2; preferably a relative permittivity less than 3.5, and/or
- a loss tangent value measured at any frequency between 3 and 10 GHz greater than that of the main dielectric substrate (solid foam, foam board, corrugated cardboard, cellular cardboard and/or fabric, preferably solid foam), preferably a loss tangent value less than $2.10^{-2}$, and/or
- a thickness at least ten times less than that of the main dielectric substrate (solid foam, foam board, corrugated cardboard, cellular cardboard and/or fabric, preferably solid foam); preferably a thickness less than 100 microns, for example less than 50 microns; and/or
- composed of plastic material, for example polyethylene, polypropylene or polyethylene terephthalate.

In a particular embodiment, the main chemical constitution of the dielectric film is identical to that of the main dielectric substrate. For illustrative purposes, if the main dielectric substrate is a polyethylene terephthalate foam, the additional dielectric film will also be based on polyethylene terephthalate.

Cardboard

As indicated previously the dielectric substrate according to the present invention could for illustrative purposes be selected from among corrugated cardboard or cellular cardboard. For illustrative purposes, the corrugated cardboard will be selected from among B-flute boards (also called PC, in general having a thickness of between 2.5 and 3.5 mm), E-flute boards (also called micro-flute boards, in general having a thickness of between 2 and 1.5 mm); F-flute boards (also called Mini-micro, in general having a thickness of around 1.2 mm), G- or N-flute boards (called Nano-flute) having a thickness of around 0.8 mm, O-flute boards, having a thickness of around 0.5 mm, or a mix of two or more of the above-mentioned cardboards.

The cardboard used in this present invention will preferably have a bulk density of less than 250 kg·m⁻. For example it will have a bulk density of less than 100 kg·m$^{-3}$.

In a particular embodiment according to the present invention, the chipless RFID tag consisting of a dielectric substrate surmounted with a pattern or patterns composed of a layer of conductive material is characterised in that the upper part of the dielectric substrate is in contact with the pattern or patterns composed of a layer of conductive material. Indeed, in addition to the advantages related to the flat/smooth surface of the upper part of the dielectric substrate mentioned above, the Applicant has also discovered that it was preferable to avoid the presence of any other material between both layers (substrate/optional film/conductive patterns), for illustrative purposes, no glue is used between these two parts of the tag.

Conductive Layer

Chipless radio frequency identification devices, preferably chipless RFID tags, according to the present invention are therefore characterised in that they consist of a particular dielectric substrate surmounted with a pattern or patterns composed of a layer of conductive material. In the particular case specific to the present invention, the chipless radio frequency identification devices, preferably chipless RFID tags, also include, under the dielectric substrate, one or more layer of conductive material; preferably under the entire surface of the dielectric substrate. The configuration containing two conductive layers, one under the dielectric substrate and the pattern or patterns above the dielectric substrate, is a particularly interesting case for the invention (dielectric substrate sandwiched between the two conductive layers) as explained below in the description of the tags with ground plane.

In a particular embodiment according to the present invention, the material of the conductive layer constituting the pattern includes (or preferably consists of) a material chosen from the group consisting of graphite, copper, nickel, silver, aluminium, platinum and/or combinations thereof, preferably copper and/or silver and/or aluminium.

In a particular embodiment according to the present invention, the conductive layer constituting the pattern is characterised by a conductive material thickness greater than 100 nm. For example a thickness of greater than 150 nm will be used. For example a thickness of greater than 200 nm will be used. For example a thickness of greater than 250 nm will be used. For example a thickness of greater than 300 nm will be used. For example a thickness of greater than 400 nm will be used. For example a thickness of greater than 500 nm will be used.

In a particular embodiment according to the present invention, the conductive layer constituting the pattern is characterised by a conductive material thickness of less than 20 microns. The conductive material thickness will be preferably less than 10 microns, or even less than 2 microns. For example a thickness of less than 1.5 microns will be used. For example a thickness of less than 1 micron will be used.

The layer of conductive material can be deposited, preferably directly on the dielectric substrate or on the optional dielectric film, by any appropriate depositing method.

According to the present invention and in a particular manufacturing methos, the dielectric substrate is presented generally in the form of a film having a rectangular or square dimensions, for example a thick sheet or a fine film in the optional mode using a dielectric film. This sheet (or film) travels, generally by means of a substrate conveyance system into a printing machine, along a transport path oriented according to a longitudinal axis from at least one inlet store supplying the said printable and/or personalisable substrates, through to at least one outlet store receiving the printed and/or personalised substrates, and therefore covered with patterns of conductive material in line with the present invention. The "side edges" of the substrate are the two edges located on both sides of this longitudinal axis; the front and/or back edges are its transversal edges. The substrate can also present in the form of a reel in a reel-reel type machine.

We cite for illustrative purposes an appropriate method for manufacturing the device/tag claimed, a conductive ink printing method, in particular a digital conductive ink printing method, more particularly an on demand ink jet digital conductive ink printing method. This on demand ink jet conductive ink printing uses preferably piezoelectric print heads.

We also cite for illustrative purposes an alternative appropriate method for the method of depositing a pattern constituted of a layer of conductive material, a method that includes a stage of digital printing of an initial pattern constituted of a print product, preferably dielectric, such as an ink, varnish and/or toner, followed by a depositing stage by overlaying on the first printed pattern an identical pattern constituted of a conductive film comprising an application film in contact with the print product and a conductive film. For illustrative purposes we will cite as an appropriate method for the stage of printing the first pattern, any digital printing method, particularly on demand ink jet digital printing. This on demand jet printing preferably uses piezoelectric print heads. For illustrative purposes, the film applications stage on the first pattern is carried out in pressure and temperature conditions resulting in the selective co-adhesion between the print product and the application film of the film for example by means of one or more sets of pinch rollers and/or one or more pressure rollers.

We will also cite for illustrative purposes as an alternative appropriate method for the method of depositing a pattern constituted of a layer of conductive material, a method by heat transfer of the conductive material.

We will also cite for illustrative purposes as an alternative appropriate method for the fabrication of the tag the method of successive assembly of films between each other comprising the development of a conductive film (for example: a cut out aluminium layer having an illustrative thickness of 5 to 20 μm) which can be deposited on an optional conveyance film (for example: a PET) before or after cutting followed by a layer of foam then a conductive film (for example a layer of aluminium). The films/layers can be held together using an appropriate glue; however, a wrapping or welding method such as described below will be preferred since it eliminates the need for glue. From an illustrative schematic point of view, this corresponds to a tag fabrication that is characterised by the production of 2 "complex" layers and one cutting stage; for example, one "complex" metal layer is made (represented in the illustrations below by the example of the aluminium) ALU/PET with glue:
- - - ALU - - - with an illustrative thickness of 5 to 20 μm
- - - Glue - - -
- - - PET - - -

Then this layer will be cut out to make the tags. Then, the last "complex" metal layer must be made (represented in the illustrations below by the example of aluminium) FOAM/ALU:
- - - FOAM - - -
- - - ALU - - -

Finally these 2 complex layers must be assembled to form the tags
ALU—with an illustrative thickness of 5 to 20 μm
- - - Glue - - -
- - - PET - - -
- - - FOAM - - -
- - - ALU - - -

We will also cite for illustrative purposes as an alternative appropriate method for the fabrication of the tag, a production of 2 "complex" layers and one chemical reaction stage. Firstly a "complex" metal layer must be made (represented in the illustrations below by the example of aluminium) ALU/PET:
- - - ALU - - - with a thickness of 5 to 20 μm (test at 12 μm)
- - - Glue - - - (optional)
- - - PET - - -

Then a protective varnish is deposited so as to form the drawing of the tag on the aluminium face (the varnish only protects the useful aluminium for the tag).

Then this layer with the varnish will be plunged into a chemical bath that will remove the aluminium that is not protected by the varnish. After, the last "complex" metal layer must be made (represented in the illustrations below by the example of aluminium) FOAM/ALU:
- - - FOAM - - -
- - - ALU - - -

Finally these 2 complex layers must be assembled to form the tag; an illustration of the corresponding successive layers is indicated below
- - - VARNISH - - - representing the tag
- - - ALU - - - representing the tag with a thickness of 5 to 20 μm
- - - Glue - - - (optional)
- - - PET - - -
- - - FOAM - - -
- - - PET - - -
- - - Glue - - - (optional)
- - - ALU - - -

The use of a scotch/aluminium can also be envisaged to fabricate a tag. It is sufficient to cut out the conductive patterns that will then be glued to the appropriate substrate selected.

We will also cite for illustrative purposes as an alternative and preferred appropriate method for the fabrication of the tag, the method of successive assembly of the tag layers by wrapping or welding at the extremity of the said layers. In this particular embodiment, the goal is to eliminate the need for glue between the successive contact surfaces of the layers of the RFID tag while ensuring an intimate contact between the said surfaces; any appropriate means to achieve this dual goal can be advantageously used. The technique of wrapping the layers and maintaining the contact between the surfaces of the said layers has been successfully experimented. A technique of welding at the extremities of the layers (close to the outer edges of the tag) has also been successfully carried out; for illustrative purposes, this welding can be advantageously carried out by means of a reel-reel type device in which the stacked layers of the tags are first rolled up then rolled out and then welded in the appropriate locations to thus capture and assemble the tags without it being necessary to first cut out the main dielectric substrate (for example solid foam).

Thus, and this constitutes a preferred embodiment according to the present invention, the chipless RFID tag will be constituted successively from bottom to top
of an optional but preferred conductive layer,
on which an optional but preferred dielectric film is mounted,
on which the main dielectric substrate is mounted (for example solid foam, foam board, corrugated cardboard, cellular cardboard and/or fabric, preferably solid foam),
on which a dielectric film is mounted on which the pattern or patterns composed of a layer of conductive material are placed, the said conductive patterns can be located either on the upper part of the tag, or advantageously between the main dielectric substrate and the dielectric film.

Therefore the present invention concerns a device, preferably a tag that possesses resonance characteristics. In a particular embodiment according to the present invention, the tag claimed is constituted of the dielectric substrates claimed and the conductive layers claimed.

Tag

For illustrative purpose, the chipless RFID tag (personalised) according to the present invention has the following characteristics:
A conductive pattern or set of conductive patterns characterising its geometry, with preferably at least one or more or all patterns being asymmetrical,
An identifier that comprises at least one fr resonance frequency and, preferably, at least one Q quality factor
Resonant in an ultrawide frequency band (UWB) characterised by a bandwidth greater than or equal to 500 MHz, preferably between 3.1 and 10.6 GHz,
With or without a ground plane, and
Polarising or preferably Depolarising.

Tag—Geometry

Thanks to the encoding possibilities offered by the method claimed, the Applicant has also developed an entire range of new tag families. Thus, in a particular embodiment, a tag will be preferably composed of at least one pattern, preferably at least two asymmetrical patterns. As an example, FIG. 1 shows the tags with a ground plane developed specifically in the framework of the present invention. This FIG. 1 illustrates four tags, each having six resonators. Two families of resonators (double L shape—in dark grey—and double parallel lines with a 45° inclination—in light grey) are used to optimise tag performance. The frequency band in which the resonance frequencies of each tag is located is indicated at the bottom left of each tag different tag geometries developed in connection with the method claimed.

Tag—Identifier

The tag according to the present invention will preferably be characterised by an identifier that comprises at least one fr resonance frequency and, preferably, at least one Q quality factor.

Resonant Tag

The tag according to the present invention is therefore resonant in an ultrawide frequency band (UWB) characterised by a bandwidth greater than or equal to 500 MHz, preferably between 3.1 and 10.6 GHz.

Passive Tag

As already explained in the introductory part, our type of chipless radio frequency identification device requires neither an integrated circuit, nor discrete electronic components, such as a transistor and/or a coil and/or a capacitance and/or an antenna for example. This type of device is therefore characterised by a passive behaviour since it must not incorporate a local power source (such as a battery).

As a reminder, by "device" is meant a packaging, a document, a tag, in particular a security document or possibly any object and/or living being on which the marking of the identification by chipless RFID can be performed or on which a holder bearing the marking can be placed.

Tag With or Without Ground Plane

The tag according to the present invention can be characterised in that it does or does not possess a ground plane. In its simplest expression, a tag with a ground plane according to the present invention is defined as a structure featuring a flat dielectric substrate of a thickness typically less than 3 mm and typically greater than 100 µm sandwiched between two metal layers (the layer of the conductive pattern mounted on the said dielectric substrate and the other conductive layer located under the dielectric substrate).

For illustrative purposes, the thickness of the conductive layer located under the substrate will be advantageously selected from among the following thicknesses.

In a particular embodiment according to the present invention, the conductive layer located under the substrate is characterised by a conductive material thickness greater than 100 nm. For example a thickness of greater than 150 nm will be used. For example a thickness of greater than 200 nm will be used. For example a thickness of greater than 250 nm will be used. For example a thickness of greater than 300 nm will be used. For example a thickness of greater than 400 nm will be used. For example a thickness of greater than 500 nm will be used.

In a particular embodiment according to the present invention, the conductive layer located under the substrate is characterised by a conductive material thickness of less than 20 microns, for example less than 10 microns, or even less than 2 microns. For example a thickness of less than 1.5 microns will be used. For example a thickness of less than 1 micron will be used.

In a particular embodiment according to the present invention, the total of the layers (conductive pattern—dielectric—conductive layer) could for example have a thickness of between 0.1 and 3 mm.

Even though we speak of a tag with or without a ground plane, technically the term "ground plane" is often associated to the metal layer (located under the substrate) the surface of which preferably corresponds totally to that of the substrate.

In a particular embodiment according to the present invention, the material of the conductive layer constituting the ground plane includes (or preferably consists of) a material chosen from the group consisting of graphite, copper, nickel, silver, aluminium, platinum and/or combinations thereof, preferably copper and/or silver and/or aluminium. In a particular embodiment according to the present invention, the material of the conductive layer constituting the ground plane is different or identical to that of the conductive pattern, preferably identical.

The second metal layer (the pattern(s)) will be made in such a way as to present a particular geometric shape corresponding to the tag patterns (like the patterns presented in FIG. 1). A tag with a ground plane is therefore a structure having two metal layers whereas a tag without a ground plane will only have one single layer i.e. the one containing the tag pattern. A tag with a ground plane has the advantage, once positioned on the ground plane side on an object, of insulating the tag electromagnetically from the object. In this case, the influence of the object on the tag is less compared to a tag without a ground plane.

It can also be noted that a tag with a ground plane is a particular case of a tag having two metal layers in which the substrate is sandwiched between them. Indeed, in this preferred configuration, one of the two layers is preferably entirely metalised. However intermediate tag configurations are possible, we can cite for example a tag with ground planes, where apertures are made on the ground plane side (metal zone withdrawals) to enable a particular behaviour to be achieved. This for example can enable new resonances to be obtained, or existing ones on the first conductive layer to be modified. They can also favour the insulation of the different resonators in the second metal layer, thus improving the decoupling of these resonances and therefore having an effect that can enable tag reading performance to be improved.

The layer of ground plane conductive material can be deposited, preferably directly on the dielectric substrate, by any appropriated depositing method. We will repeat for illustrative purposes the depositing methods mentioned above for depositing the conductive patterns.

We can also note that a chipless tag having two conductive layers with the dielectric layer in the middle, can also be made, for cost reasons, by surrounding the substrate with the conductive layers, by folding for example. In this case, the conductive layer can have a surface at least twice as big as that of the substrate, typically a width at least twice as big with the same length. Once this surface containing the conductive patterns and/or the ground plane has been made, it will be advantageously carried over in one operation around the dielectric layer. This is possible by folding it all around. The only difference with the conventional approach (the two metal layers carried over one by one to each face of the dielectric) is the presence of the metalised layer on one or more of the sides of the dielectric. If this part is not metalised, no significant difference compared to the more conventional approach is present. However the possibility of metalising this part (one or lire sides of the dielectric) will enable more complex structures to be made, which like a metal walled resonator cavity, will enable the quality factor to be improved. Thus a person skilled in the art is capable of taking advantage of this structure which is also easier to make since it requires fewer manufacturing stages. Indeed, this latter approach reduces the number of technological steps: print one single conductor media, and bond one single support also.

In a particular application according to the present invention, the dielectric substrate (with or without a ground plane) will be selected from among commonly sold materials used for heat insulation or acoustic insulation the characteristics of which correspond to those claimed in the present invention; and the desired conductive patterns will be placed directly on these commonly sold materials.

The present invention applies therefore advantageously both to tags without a ground plane and to tags with a ground plane.

Depolarising Tag

The tag according to the present invention will preferably be characterised by the fact that it is polarising or preferably depolarising. A depolarising tag is a tag capable of emitting a wave with a polarisation oriented perpendicularly to the incident one (we then speak of cross polarisation).

In a particular embodiment according to the present invention, the chipless RFID tag has a ratio between the total upper surface of the dielectric substrate and the upper surface of the dielectric substrate covered with the pattern(s) comprising a layer of conductive material, greater than 2.

In a particular embodiment according to the present invention, the chipless RFID tag with a ground plane has a ratio between the lower surface of the dielectric substrate covered with the layer of conductive material and the total lower surface of the dielectric substrate, greater than 0.9.

Reader

For illustrative purposes, in the framework of the present invention, the reader is a reader that transmits/receives electromagnetic waves; the operating principle of the said reader is based on the emission of an electromagnetic signal in the direction of the identification device (for example the tag) which will reflect the said signal depending on its geometry (and for example its specific resonance characteristics) and on the capture of the said reflected signal by the reader—thus, the processing of the signal received (notably through a decoding stage) will enable access to the information contained in the device (for example, the tag).

Thus, in general, chipless radio frequency identification devices according to the present invention are part of an RFID system that also includes one or more RFID readers that are themselves connected or not to supervising computers or to an electronic board that performs processing that could for example make the link with existing databases. These readers are used therefore to identify objects by means of the RFID tags affixed to them, the said chipless RFID tags being assimilable to a static radar target with a specific electromagnetic signature. Thus, in a particular embodiment of the present invention, chipless RFID readers care therefore assimilable to a radar in operating terms, for example an air radar detecting the signature of aircraft to within a scale and power ratio. For illustrative purposes, chipless RFID tags can be seen as radar targets possessing a particular timing or frequency signature. Any type of radar appropriate for receiving/identifying the signal emitted back by the RFID tag could advantageously be used in the framework of this invention; we will cite the impulse radar for illustrative purposes without being restricted to this.

The encoding capacities obtained by means of chipless radio frequency identification devices according to the present invention meet the standards in force since the tags obtained enable at least 40 bits of information to be had and this corresponds to EAN 13 type barcodes. For illustrative purposes, values of over 40 bits for a credit card format [i.e. 40/(85.60×53.98 mm)=40/46 bits/cm$^2$] have been obtained: thus in a particular embodiment according to the present invention, the devices claimed are characterised by an encoding capacity value greater than 0.85 bits/cm$^2$, for example greater than 1 bits/cm$^2$, greater than 2 bits/cm$^2$, even greater than 5 bits/cm$^2$.

In a variant of the present invention, the tag claimed could be placed on any type of object and/or living being (for example an animal or a human). In a variant of the present invention, the object on which the tag will be affixed (preferably bonded) can be selected from a wide range of materials of which we cite as non-restrictive examples, metal, paper, fabric, plastic, for example a methacrylic copolymer resin, polyester, polycarbonate, polyethylene, polypropylene, and/or polyvinyl chloride, or even cellulosic type materials such as wood or plywood for example or cristalline materials such as glass or ceramics, for example the complex materials comprising one or more of these components such as milk cartons for example.

In a variant of the present invention and on condition that the dielectric substrate of the tag claimed meets the requirements of one or more of the claims 1 to 13, the said dielectric substrate could be selected from a wide range of materials of which we cite as non-restrictive examples, paper, fabric, plastic, for example a methacrylic copolymer resin, polyester, polycarbonate, polyethylene, polypropylene, and/or polyvinyl chloride, or even cellulosic type materials such as wood or plywood for example or cristalline materials such as glass or ceramics, for example the complex materials comprising one or more of these components such as milk cartons for example.

The present application describes various technical characteristics and advantages in reference to the Figures and/or to various embodiments. The person skilled in the art will understand that the technical characteristics of a given embodiment can in fact be combined with the characteristics of another embodiment unless indications to the contrary are explicitly mentioned or that it is not obvious that these characteristics are incompatible or that the combination does not provide a solution to at least one of the technical problems mentioned in this application. Furthermore, the technical characteristics described in a given embodiment can be isolated from the other characteristics of this embodiment unless indications to the contrary are explicitly mentioned.

It must be obvious for persons skilled in the art that the present invention enables embodiments in numerous other specific forms without moving away from the application domain of the invention as claimed. Consequently, the present embodiments must be considered as being for illustration purposes, but can be modified in the domain defined by the scope of the enclosed claims, and the invention must not be limited to the details given above.

EXAMPLE

Packaging material—characteristics
Polymer film 1 mm thick
Bulk density: 60 kg/m$^3$
Relative permittivity measured 1.036 at 3.21 GHz and 1.035 at 3.89 GHz.
Loss tangent measured: $1.9 \times 10^{-5}$ at 3.21 GHz and $3.7 \times 10^{-5}$ at 3.89 GHz.

By using a packaging material available off-the-shelf as the dielectric substrate and having the characteristics indicated above, we made tags with a ground plane having the following characteristics:
Aluminium layer 10 microns thick under the entire surface of the substrate,
Conductive patterns similar to those in FIG. 1, made from aluminium and 10 microns thick.

These tags are characterised by different identifiers and higher quality factors.

In a particular embodiment according to the present invention, the chipless RFID tag will be constituted successively:
of an optional but preferred conductive layer the thickness of which is between 200 nm and 20 microns, for example less than 10 microns, or even less than 2 microns, on which an optional but preferred dielectric film is mounted the thickness of which is between 5 microns and 100 microns, on which the main dielectric substrate is mounted (for example solid foam, foam board, corrugated cardboard, cellular cardboard and/or fabric, preferably solid foam) the thickness of which is between 0.5 mm and 3 mm, on which a dielectric film is mounted the thickness of which is between 5 microns and 100 microns on which the pattern or patterns composed of a layer of conductive material are placed the thickness of which is between 200 nm and 20 microns, for example less than 10 microns, or even less than 2 microns.

This RFID tag is also advantageously characterised by width and length dimensions of all its layers (except the conductive patterns of course) which are close to those of a credit or bank card; for illustrative purposes, these dimensions will be preferably between 86 mm+−2 mm for the length and 54+−2 mm for the width (the more precise dimensions preferred being 85.725×53.975 mm).

The invention claimed is:

1. Chipless RFID tag comprising:
a dielectric substrate on which a pattern or patterns are mounted composed of a layer of conductive material, wherein the dielectric substrate has a relative permittivity measured at any frequency between 3 and 10 GHz of between 1 and 2, a bulk density less than 250 kg·m$^{-3}$, and a loss tangent value measured at any frequency between 3 and 10 GHz of less than $10^{-3}$.

2. Chipless RFID tag according to claim 1 wherein the dielectric substrate has a relative permittivity between 1.001 and 1.25.

3. Chipless RFID tag according to claim 1 wherein the loss tangent value is less than $2·10^{-4}$.

4. Chipless RFID tag according to claim 1 wherein the dielectric substrate is composed of a dielectric substrate having a relative permittivity between 1.001 and 1.25 and/or a loss tangent value less than $2·10^{-4}$ and/or a bulk density less than 100 kg·m$^{-3}$ on which a dielectric film is mounted, on which is placed the pattern or patterns composed of a layer of conductive material.

5. Chipless RFID tag according to claim 4 wherein the dielectric film is characterised by one, two or more of the following characteristics:
a relative permittivity measured at any frequency between 3 and 10 GHz greater than that of a main dielectric substrate, and/or
a loss tangent value measured at any frequency between 3 and 10 GHz greater than that of the main dielectric substrate, and/or
a thickness at least ten times less than that of the main dielectric substrate, and/or
composed of plastic material.

6. Chipless RFID tag according to claim 1 wherein an upper part of the dielectric substrate is in contact with the pattern or patterns composed of a layer of conductive material.

7. Chipless RFID tag according to claim 1 wherein the thickness of the dielectric substrate is greater than 0.5 mm.

8. Chipless RFID tag according to claim 1 wherein a thickness of the dielectric substrate is less than 3 mm.

9. Chipless RFID tag according to claim 1 wherein the conductive layer constituting the pattern has a conductive material thickness greater than 200 nm and less than 20 microns.

10. Chipless RFID tag according to claim 1 wherein the conductive layer constituting the pattern has a conductive material thickness greater than 400 nm and less than 2 microns.

11. Chipless RFID tag with ground plane according to claim 1 further comprising a layer of conductive material under the dielectric substrate.

12. Chipless RFID tag according to claim 11 wherein the layer of conductive material under the dielectric substrate has a conductive material thickness greater than 200 nm and less than 20 microns.

13. Chipless RFID tag according to claim 11 wherein the layer of conductive material under the dielectric substrate has a conductive material thickness greater than 400 nm and less than 2 microns.

14. Chipless RFID tag according to claim 1 wherein the dielectric substrate is selected from the group consisting of dielectric substrates made from solid foam, foam board, corrugated cardboard, cellular cardboard and fabric.

15. Chipless RFID tag according to claim 1 wherein the dielectric substrate is a solid polymer foam.

16. Chipless RFID tag according to claim 1 wherein the dielectric substrate is a solid polymer foam having a bubble density of between $10^4$ and $10^9$ bubbles/cm$^3$.

17. Chipless RFID tag according to claim 1 wherein the dielectric substrate is a solid polymer foam having a bubble size the average diameter of which is between 20 microns and 200 microns.

18. Chipless RFID tag according to claim 1 wherein a ratio between a total upper surface of the dielectric substrate and an upper surface of the dielectric substrate covered with the pattern(s) composed of a layer of conductive material, is greater than 2.

19. Chipless RFID tag according to claim 1 with a ground plane being a layer of conductive material under the dielectric substrate wherein a ratio between a lower surface of the dielectric substrate covered with the layer of conductive material and a total lower surface of the dielectric substrate, is greater than 0.9.

20. Chipless RFID tag according to claim 1 comprising:
a conductive layer,
on which a dielectric film is mounted,
on which the main dielectric substrate is mounted
on which a dielectric film is mounted,
on which the pattern or patterns composed of a layer of conductive material are placed.

21. Chipless RFID tag according to claim 20 wherein:
the conductive layer has a thickness of between 200 nm and 20 microns,
on which a dielectric film is mounted a thickness of which is between 5 microns and 100 microns,
on which the main dielectric substrate is mounted a thickness of which is between 0.5 mm and 3 mm,
on which a dielectric film is mounted a thickness of which is between 5 microns and 100 microns,
on which the pattern or patterns composed of a layer of conductive material are placed a thickness of which is between 200 nm and 20 microns.

22. A process of manufacturing the chipless RFID tag according to claim 1, comprising wrapping or welding at an extremity of the layers making up the tag so as to keep the layers in contact without glueing the layers.

* * * * *